United States Patent
Pan et al.

(10) Patent No.: US 6,370,065 B1
(45) Date of Patent: Apr. 9, 2002

(54) SERIAL SEQUENCING OF AUTOMATIC PROGRAM DISTURB ERASE VERIFY DURING A FAST ERASE MODE

(75) Inventors: Feng Pan, Richmond; Colin Bill, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/667,347

(22) Filed: Sep. 22, 2000

Related U.S. Application Data

(60) Provisional application No. 60/184,978, filed on Feb. 25, 2000.

(51) Int. Cl.$^7$ .............................................. G11C 16/04
(52) U.S. Cl. .............................. 365/185.29; 365/185.11; 365/185.33
(58) Field of Search ....................... 365/185.11, 185.22, 365/185.29, 185.33

(56) References Cited

U.S. PATENT DOCUMENTS

| | | | | |
|---|---|---|---|---|
| 5,384,743 A | * | 1/1995 | Rouy | 365/185.11 |
| 5,963,477 A | * | 10/1999 | Hung | 365/185.22 |
| 6,046,932 A | * | 4/2000 | Bill et al. | 365/185.02 |
| 6,147,905 A | * | 11/2000 | Seino | 365/185.11 |

\* cited by examiner

*Primary Examiner*—Son Mai

(57) ABSTRACT

A method for serial sequencing the automatic disturb erase verify (APDEV) function during a multiple sector fast erase mode. The fast erase mode allows a memory device to erase several sectors of memory cells simultaneously. In order to minimize the time required to complete the APDEV and APDE functions, latches store for the address lines of the sector column positions. The APDEV function, therefore, can be performed serially on each of the sectors in the multiple sector group instead of all the sectors in the group simultaneously, thereby decreasing the amount of time required for the APDEV and APDE functions during the fast erase mode.

16 Claims, 4 Drawing Sheets

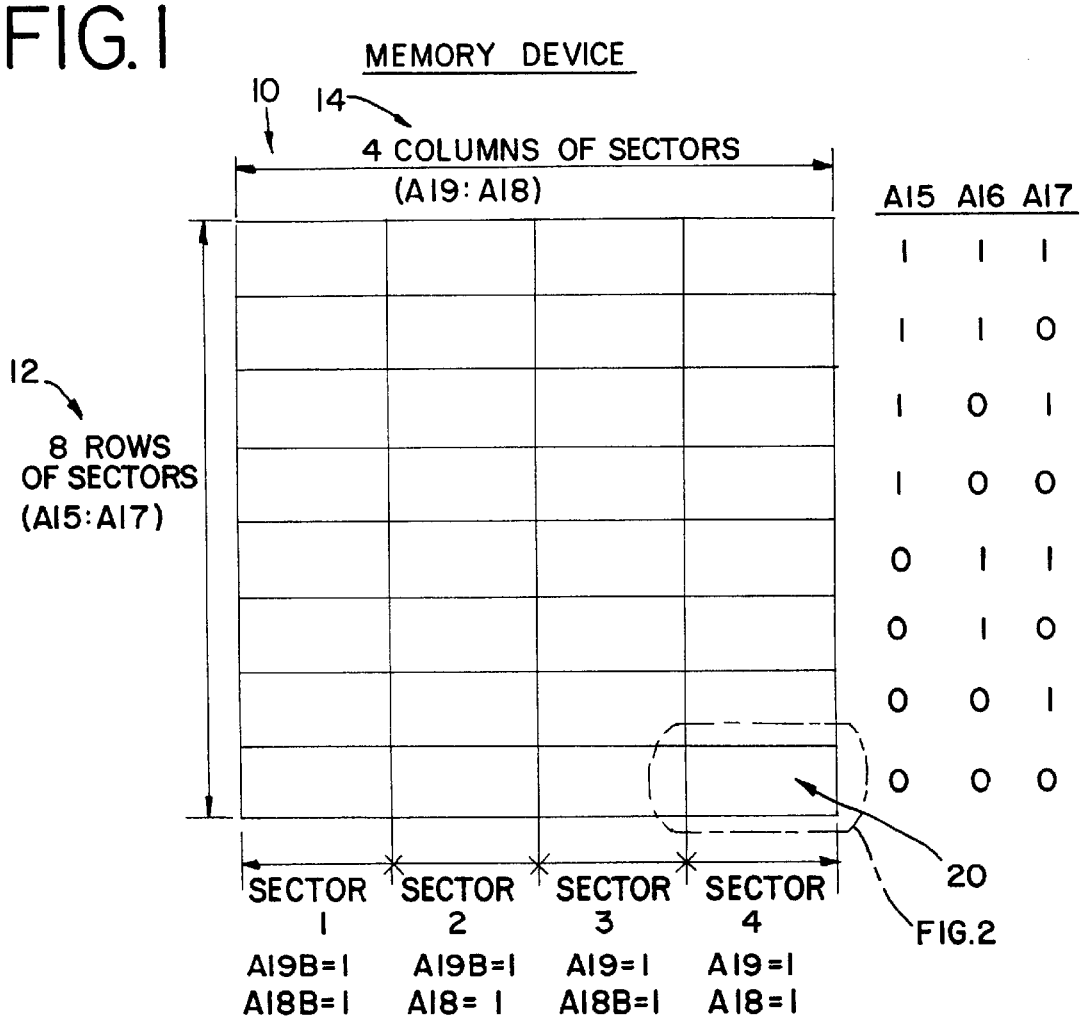
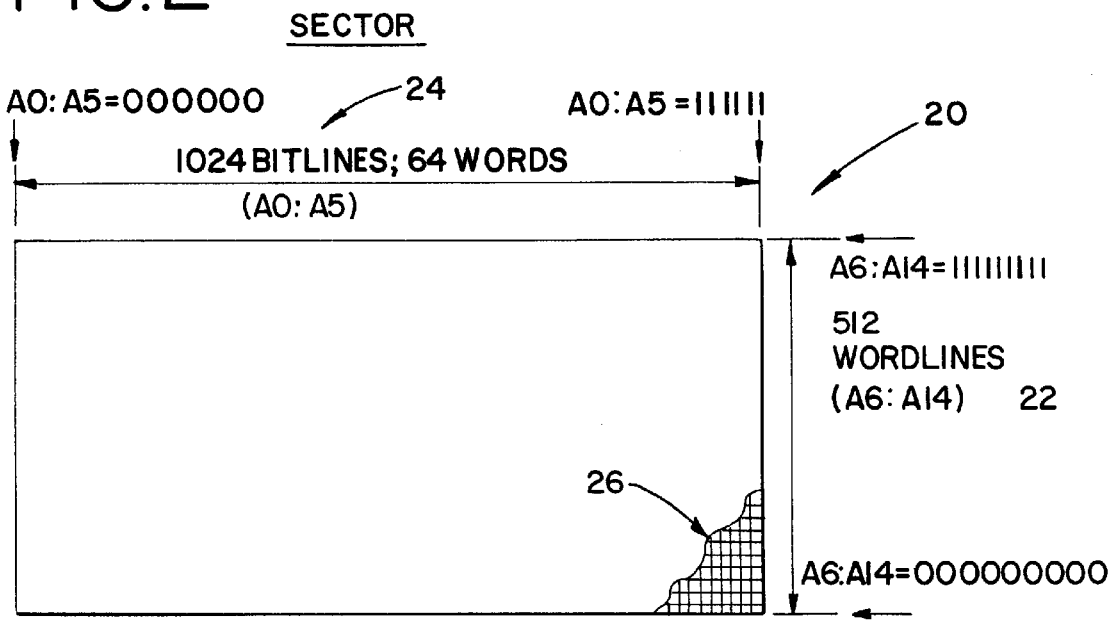

FIG.3

REGULAR ERASE MODE SECTOR SELECTION

| SECTOR | CRITERIA FOR SECTOR SELECTION | | STATUS OF ADDRESSES | | | |
|---|---|---|---|---|---|---|
| | | | A19 | A18 | A19B | A18B |
| 32 → 4 | A19=1 | A18=1 | 1 | 1 | 0 | 0 |
| 34 → 3 | A19=1 | A18B=1 | 1 | 0 | 0 | 1 |
| 36 → 2 | A19B=1 | A18=1 | 0 | 1 | 1 | 0 |
| 38 → 1 | A19B=1 | A18B=1 | 0 | 0 | 1 | 1 |

FIG.4

FAST MODE MULTIPLE SECTOR SELECTION

| SECTORS SELECTED | STATUS OF ADDRESSES | | | |
|---|---|---|---|---|
| 42 | A19 | A18 | A19B | A18B |
| 44 → 4,3,2,1 | 1 | 1 | 1 | 1 |
| 46 → 3,1 | 1 | 0 | 1 | 1 |
| 48 → 2,1 | 0 | 1 | 1 | 1 |
| → 1 | 0 | 0 | 1 | 1 |

FIG.5

FAST MODE APDEV SEQUENCING

ADDRESS SEQUENCES PROVIDED BY STATE MACHINE

| SECTOR SEQUENCE | STEP 1 | | STEP 2 | | STEP 3 | | STEP 4 | |
|---|---|---|---|---|---|---|---|---|
| 52 | A19 | A18 | A19 | A18 | A19 | A18 | A19 | A18 |
| 54 → 4→3→2→1 | 1 | 1 | 1 | 0 | 0 | 1 | 0 | 0 |
| 56 → 3→2→1 | 1 | 0 | 0 | 1 | 0 | 0 | | |
| → 2→1 | 0 | 1 | 0 | 0 | | | | |
| 58 → 1 | 0 | 0 | | | | | | |

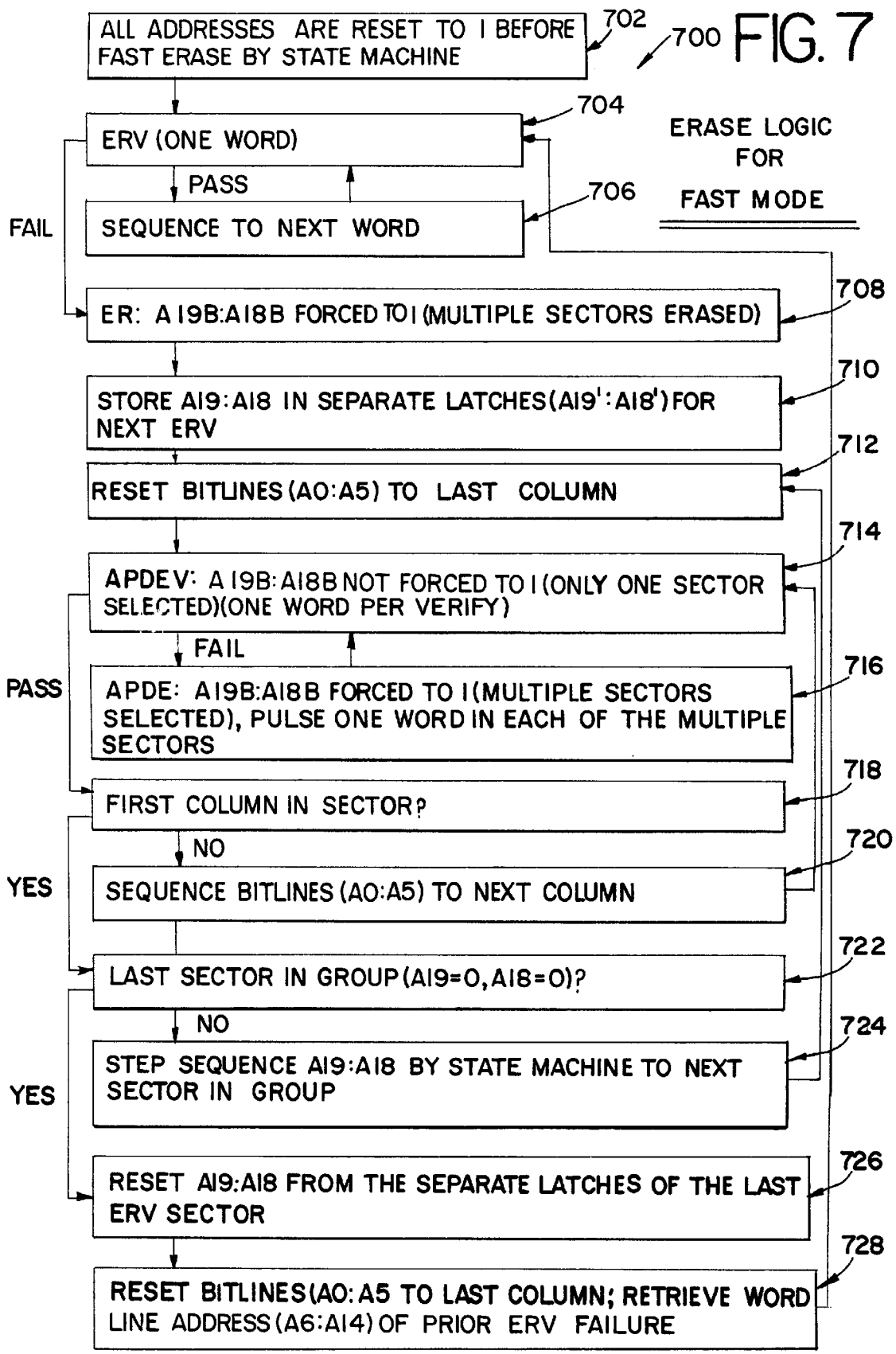

SERIAL SEQUENCING OF AUTOMATIC PROGRAM DISTURB ERASE VERIFY DURING A FAST ERASE MODE

This application claims benefit of No. 60/184,978 filed Feb. 25, 2000.

FIELD OF THE INVENTION

The present invention relates generally to memory devices and, more particularly, to a method for increasing the speed of an erase operation during a multiple sector fast erase mode.

BACKGROUND OF THE INVENTION

One type of memory device that has found wide commercial success in the electronic industry is commonly referred to as flash memory. This commercial success is due in part to the ability of flash memory devices to store electronic data over long periods of time without an electric power supply. In addition, flash memory devices are erasable and programmable on-board by the end users of the electronic devices which include the flash memory. This combined functionality is especially useful in electronic device applications like cellular telephones, personal digital assistants, and computer BIOS storage, and other applications where power supply is intermittent and programmability is desired.

Flash memory devices are made up of an array of individual memory transistors, or cells, which are similar to those used in other types of memory devices. Flash memory devices, however, typically achieve their non-volatility functionality by the addition of a floating gate between the control gate and the substrate region of the memory transistors. Like other memory devices, the transistors are oriented into rows and columns to form the array of transistors. As is common in the memory device art, common wordlines are electrically connected to the control gates of the cells within each row of the array. Similarly, common bitlines are electrically connected to the drain regions of the cells within each column of the array. Finally, a common source line is electrically connected to the source regions of all the cells in the array. In some flash memory devices the array of transistors is subdivided into sectors of separate transistor arrays to provide added flexibility to the programming and erasing operations.

The data stored in each particular cell represents a binary 1 or 0, as is well-known in the art. To perform a program, read, or erase operation on a particular cell in the array, various predetermined voltages are applied to combinations of the wordline, bitline, and source line. By applying the voltages to a particular bitline column, a particular wordline row, and the array source, individual cells at the intersection of the bitline and wordline can be selected to be read or programmed.

To program a cell, the control gate and the drain region of the cell are raised to predetermined programming voltages and the source is grounded. The voltages on the control gate and the drain region cause the generation of hot electrons which are injected onto the floating gate where they become trapped, forming a negative charge on the floating gate. This electron transfer mechanism is often referred to as Channel Hot Electron (CHE) injection. When the programming voltages are removed, the negative charge on the floating gate is maintained, thereby raising the threshold voltage. The threshold voltage is used during reading operations to determine if the cell is in a charged state, or programmed (0), or whether the cell is in an uncharged state, or un-programmed (0).

Cells are read by applying a predetermined voltage to the control gate and the drain region and grounding the source of the cell. The current in the bitline is then sensed. If the cell is programmed, the threshold voltage will be relatively high and the bitline current will be zero or at least relatively low, thus registering a binary 0. On the other hand if the cell is erased, the threshold voltage will be relatively low and the bitline current will be relatively high, thus registering a binary 1.

In contrast to the programming procedure, flash memory devices are typically bulk-erased by simultaneously erasing all the cells in a memory sector. One procedure for erasing an entire memory sector involves applying predetermined voltages to the common source line and wordlines of the sector, while the drain of the cells are left to float. This causes electron tunneling from the floating gate to the source through Fowler-Nordheim (F-N) tunneling, which removes the negative charge from the floating gate of each of the cells in the memory sector.

Cells in the NOR memory configuration are typically erased by applying an erase voltage pulse for a predetermined time frame. Ideally, each cell in the memory sector will require the same amount of time to remove the electrons from the floating gate. In reality, however, erase times among the cells within the memory sector vary, and some of the cells which are subjected to the erase pulse may become over-erased. In an over-erased cell the threshold voltage becomes lowered to a point where the cell causes electrical current to leak to the bitline even if the gate of the cell is grounded. Excessive current leakage can prevent proper reading and programming of other cells.

To correct excessive current leakage, the bitlines are typically verified during an Automatic Program Disturb Erase Verify ("APDEV") operation that occurs automatically as part of an Automatic Program Disturb Erase ("APDE") operation, which is part of an erase operation. The APDEV operation verifies that each bitline does not contribute excessive current leakage above a predetermined allowable leakage, or reference current, and takes corrective action if necessary. During the APDEV operation, a bias voltage is applied to all the wordlines in the sector, and each bitline in the sector is sequentially sensed for current above the reference current. If the bitline current is above the reference current, an APDE operation is performed on all the cells in the bitline. The APDE operation is a soft program that mainly affects the over-erased cells by raising their threshold voltage. After the APDE operation, the bitline current is sensed again and the APDE operation is repeated if necessary until the current sensed in the bitline during the APDEV operation is below the reference current.

One method which can be used to increase the speed of the erasing operations involves selecting several sectors at one time and performing the bulk erase procedure on all these sectors simultaneously. This method of erasing is sometimes referred to as a fast erase mode. The particular combination of multiple sectors that are selected for simultaneous erasing in this mode is usually chosen by the memory device's state machine, or logic center, and depends primarily on the erase current. For example, in many cases a full erasure of all the sectors is not possible because the total erase current required would surpass the amount of current available to the memory chip.

Some of the erasing procedures, however, become inefficient when performed on several sectors simultaneously. One such procedure is the APDEV and the APDE. As previously explained, the APDEV operation verifies that current leakage is below a reference current. However, when multiple sectors are selected during the APDEV operation, the current leakage that is measured is multiplied by the number of sectors selected since the bitlines from each of these sectors are verified simultaneously. This situation can significantly increase the time required for the APDEV and the APDE procedure to be completed because the allowable current leakage in each of the bitlines is effectively lowered in the multiple sector erase. The ability of APDE to correct the current leakage is exponentially reduced as the threshold voltage of the over-erased cells is increased, which means the total time required for the APDEV and APDE functions will grow exponentially.

In one example of this problem, the reference current is 5 $\mu A$. Thus, when a single sector is selected, the APDEV function measures and verifies that the current leakage in each bitline in the sector is less than 5 $\mu A$. The APDEV function takes about 400 ns per sixteen bitlines, to complete. Each time a bitline is found that has a current leakage greater than 5 $\mu A$, the APDE function applies a voltage pulse to the bitline to correct the current leakage. The APDE function takes about 100 $\mu s$ to complete each time it is required. In tests, the total time to complete the APDEV and APDE functions on a single sector has been estimated to be 527.6 $\mu s$. In contrast to this single sector APDEV, when four sectors are simultaneously selected, the APDEV function will measure the current leakage from one bitline in each of the four sectors simultaneously. As a result, the current leakage in each of four different bitlines will be added together. Thus, the reference current of 5 $\mu A$ will be more difficult to satisfy, requiring more APDE pulses to correct the current leakage. In tests, the total time to complete the APDEV and APDE functions on four sectors simultaneously has been estimated to be 10.56 ms.

BRIEF SUMMARY OF THE INVENTION

In order to minimize the time required for the APDEV and the APDE functions, latches store the status of the address lines that define the sector column positions. When the APDEV function is entered, the multiple sector group is no longer selected, and each of the individual sectors in the multiple sector group are selected in separate sequence steps provided by the state machine. The APDEV function, therefore, is performed on each of the sectors in the multiple sector group serially instead of on all of the sectors simultaneously. After the APDEV and the APDE functions are completed, the address lines for the sector column positions are reset to their original status before the APDEV function was performed by the latches.

BRIEF DESCRIPTION OF SEVERAL VIEWS OF THE DRAWINGS

The invention, including its construction and method of operation, is illustrated more or less diagrammatically in the drawings, in which:

FIG. 1 is a schematic drawing of a memory device, showing the layout of the sectors;

FIG. 2 is a schematic drawing of a sector, showing the layout of the memory cells;

FIG. 3 is a table, showing the criteria for selection of each of the column positions of the sectors;

FIG. 4 is a table, showing the multiple sectors that are selected in fast erase mode;

FIG. 5 is a table, showing the address sequence steps provided by the state machine during the fast erase mode for the APDEV function;

FIG. 7 is a flow chart, showing the erase logic for multiple sectors in fast erase mode.

DETAILED DESCRIPTION OF THE INVENTION

Figure 6:
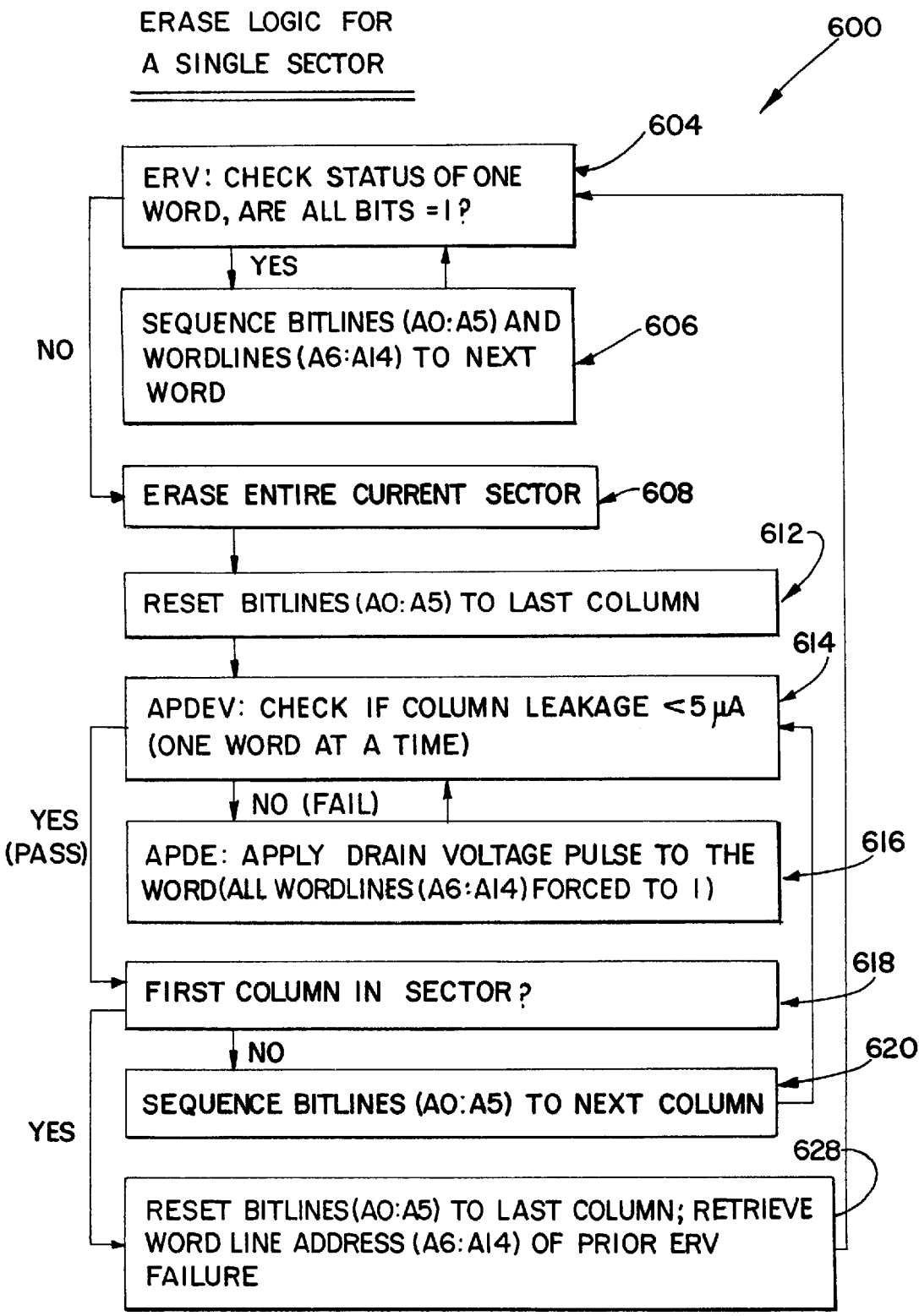
FIG. 6 is a flow chart, showing the erase logic for a single sector in regular mode.

Referring now to the drawings and the present invention, a typical layout of a flash memory device 10 is shown FIG. 1. In this layout, the memory device 10 includes a total of 32 sectors 20, arranged into 8 rows 12 and four columns 14 of sectors 20. As further shown in FIG. 2, each of the sectors 20 includes 512 wordlines 22 and 1024 bitlines 24. As is common in the semiconductor industry, each of the bitlines 24 is commonly connected to a column of memory cells 26, and each of the wordlines 22 is commonly connected to a row of memory cells 26. Not all the memory cells are shown in FIG. 2. In the embodiment shown, each sector 20 therefore includes 524,288 bits, or 0.5 Mbits, (512*1024=524, 288), of memory cells 26. Accordingly, the entire memory device 10 includes 16 Mbits (524,288*32÷1024=16.4).

As is well known to those in the art, the memory device 10 uses an address decoding system to access each of the individual memory cells 26 for the various read/write functions that are performed during operations of the device 10. In the present embodiment, a total of 20 address lines (A0:A19) are used to access the memory cells 26. Referring again to FIG. 2, the memory device 10 includes 16 data input/output pins so that the memory cells 26 are accessed in 16 bit groups, or one word per group. The 1024 bitlines 24, thus, comprise 64 words 24 of data (1024÷16=64). The column position 24 of a particular word is defined by the address lines of A0:A5 ($2^6$=64), where the binary sequence 111111 identifies the right-most column and the binary sequence 000000 identifies the left-most column. Likewise, the row position 22 of a word is defined by address lines A6:A14 ($2^9$=512), where the binary sequence 111111111 identifies the top-most row and the binary sequence 000000000 identifies the bottom-most row.

Referring to FIG. 1, a similar address decoding system is used for accessing particular sectors 20. Thus, address lines A15:A17 ($2^3$=8) define the row position 12 of the sectors 20, where the binary sequence of 111 identifies the top-most row of sectors and the binary sequence of 000 identifies the bottom-most row of sectors.

Referring both to FIG. 1 and FIG. 3, the column position 14 of the sectors 20 are defined by various combinations of address lines A19:A18 and address lines A19B:A18B. In regular erase mode, address lines A19B:A18B are the inverse of the corresponding address lines A19:A18. Thus, for example, when A19 is 1, A19B will be 0. The selection criteria for each of the sector column positions 14 is shown in FIG. 3. For example, when A19 is 1 and A18 is 1, sector 4, or the right-most sector, will be selected 32. Accordingly, when A19B is 1 and A18B is 1, sector 1, or the left-most sector, will be selected 38.

This selection criteria for the column positions of the sectors allows the memory device to operate in ER and APDE of a fast erase mode, in which multiple sectors are selected and accessed simultaneously. This feature is accomplished by forcing A19B and A19B to 1 when the fast erase mode is entered. Thus, in this mode A19B and A18B no longer represent the inverse of A19:A18 but instead are 1, regardless of the status of A19:A18. Therefore, by comparing FIG. 4 and FIG. 3, it can be seen that multiple sectors will be selected in the fast erase mode as a result of A19B and A19B being forced to 1. For example, when both A19 and A18 are 1, it can be seen by reviewing FIG. 3 that the selection criteria for all the sectors will be satisfied; and therefore all the sectors will be simultaneously selected 42. In another example, when A19 is 0 and A18 is 1, the selection criteria for only sector 2 and sector 1 will be satisfied; therefore only sectors 2 and 1 will be simultaneously selected 46.

As can be appreciated, this fast erase mode increases the speed of the erasing operations by allowing simultaneous access to the memory cells in multiple sectors. The time required for some erase operations, however, is increased by the fast erase mode instead of being decreased as desired. In particular, the time required for the APDEV and the APDE functions can increase from 527.6 $\mu$s when a single sector is selected to 10.56 ms when all four sectors are selected, increasing more than the sum of four single sectors. Therefore, in accordance with the present invention a latch is included which allows the APDEV and the APDE functions to be performed on the individual sectors in a multiple sector selection separately.

The regular erase logic, in which a single sector is erased without multiple sectors being selected, is shown in FIG. 6. The erase logic begins with an erase verify function, or ERV, which accesses each word of the sector to verify that all the bits in the word have been erased so that the bits are 1, block 604. After each word is successfully verified, the ERV function is sequenced to the next word until all the words in the sector are verified, progressing from the right-most word in the sector to the left-most word in the sector and thereafter progressing along each wordline from the top-most wordline to the bottom-most wordline, block 604. In the usual erasing procedure, the first word that is checked by the ERV function will fail because the sector will have been preprogrammed so that all the bits will be 0 instead of 1. When this failure of ERV occurs the bulk erase function, or ER, will erase the entire sector in a bulk erase operation, block 608.

After the sector is erased, the memory cells must be tested for over-erasure and corrected accordingly by the APDEV and APDE functions. The APDEV and APDE functions are performed on an entire column of memory cells, or sixteen input/outputs, in the sector at a time. Therefore, the address lines of A0:A5 are reset to the right-most column in the sector and all the wordlines in the sector are activated, block 612. The APDEV function then tests each column of memory cells in the sector to ensure that current leakage is less than a predetermined threshold, such as 5 $\mu$A, block 614. If the current leakage in a bitline is greater than the threshold, the APDE function will apply voltage pulses to the bitline until the current leakage is less than the threshold, block 616. After each column is tested, the APDEV and APDE functions progress leftwards to the next column of memory cells until the entire sector has been tested and corrected, blocks 618, 620. When all the columns have been completed, the address lines of A0:A14 are reset, and the ERV function resumes until all the words in the sector are verified, blocks 628, 604.

Turning to FIG. 7, the erase logic for the fast erase mode is shown, which is similar in structure to the regular erase mode. In the fast erase mode, multiple sectors can be selected for simultaneous erasing and APDE. Usually the multiple sector group will be determined by the state machine and will be dependent on the status of address lines A19:A18, block 702. Like the regular erase mode, the fast erase mode begins at block 704 with the ERV function. The ERV function is performed on individual words; therefore the multiple sector group is not selected during ERV, block 706. However, when the ER function is performed after the ERV function, the multiple sector group is selected by forcing A19B:A19B to 1, block 708. Therefore, as described earlier, several sectors will be selected and bulk erased simultaneously, increasing the speed of the erasing operation.

After the ER function is complete, the status of A19:A18 is latched within address lines of A19':A18', block 710. A19':A18' are temporary storage locations in which the original status of A19:A18 can be stored during the APDEV and APDE functions. The erase logic then proceeds to perform the APDEV and the APDE functions, blocks 714, 716. Because of the excessive time that is required to perform the APDEV function across multiple sectors, address lines A19B:A18B will not be forced to 1, and instead will represent the inverse of A19:A18, block 714. As a result the APDEV function will be performed on a single column of memory cells, or sixteen input/outputs, in a single sector instead of columns of memory cells from several sectors, block 714. When APDE voltage pulses are required however, A19B:A19B will be forced to 1, and the APDE function will be performed on the selected column from all of the sectors in the group simultaneously, block 716. The APDE function, therefore, will be acting on some columns of memory cells in other sectors than the column that the APDEV function was performed on. This situation, however, does not adversely affect those other columns of memory cells because the APDE function is designed to only correct current leakage and does not affect memory cells without current leakage.

When the APDEV function has completely sequenced through the entire sector, blocks 718, 720, progressing from the right-most column to the left-most column, the state machine sequences A19:A18 to the next sector in the multiple sector group, block 724. In FIG. 5 the sequences provided by the state machine are shown. By referring to the current status of A19:A18, the state machine is able to determine which sectors are included in the multiple sector group. Thus, for example, if A19:A18 is 11, which indicates that all four sectors are included in the multiple sector group, the state machine will sequence A19:A18 serially through all of the sectors by providing the four step sequence shown in FIG. 5 at 52. After each new step sequence is provided by the state machine, the APDEV and the APDE functions will continue their operations in a serial sequence on the next sector in the multiple sector group, block 722 When the last sector in the multiple sector group has been completed, A19:A18 are reset to their original status by setting them equal to A19':A18', block 726. The ERV function then resumes and proceeds to test all the words in the multiple sector group to ensure that all the memory cells have been erased, blocks 728, 704.

It should be understood that the particular structuring and ordering of the memory cells 26 and sectors 20 in the memory device 10 is illustratrive only. Other sizes, configurations, and orderings may be substituted. Further, the memory device 10 includes peripheral circuitry, such as addressing circuits, read sensors, a state machine, etc. Other ordering of the logic diagrams may also be used.

While a preferred embodiment of the invention has been described, it should be understood that the invention is not so limited, and modifications may be made without departing from the invention. The scope of the invention is defined by the appended claims, and all devices that come within the meaning of the claims, either literally or by equivalence, are intended to be embraced therein.

We claim:

1. A method for erasing a memory device, comprising:
   a) erasing a group of sectors simultaneously;
   b) verifying the current leakage of a number of cells in one sector of said group of sectors;
   c) correcting the current leakage of said number of cells in said one sector of said group of sectors; and
   d) serially sequencing said verifying and correcting and performing said verifying and correcting on each sector of said group of sectors.

2. The method for erasing a memory device according to claim 1, wherein said sequencing sequences a number of address lines that define sector positions in said memory chip.

3. The method for erasing a memory device according to claim 2, further comprising:
   a) latching the status of said number of address lines that define said group of sectors before said sequencing; and
   b) resetting said number of address lines to said latched status after said sequencing.

4. The method for erasing a memory device according to claim 3, wherein said sequences of said address lines are provided by a state machine.

5. The method for erasing a memory device according to claim 4, wherein:
   a) said group of sectors is defined by a fast erase mode that forces the inverses of said number of address lines to a predetermined status; and
   b) said inverses of said number of address lines are not forced to said predetermined status during said verifying.

6. The method for erasing a memory device according to claim 5, wherein:
   a) said verifying is an Automatic Program Disturb Erase Verify (APDEV) function; and
   b) said correcting is an Automatic Program Disturb Erase (APDE) function.

7. The method for erasing a memory device according to claim 1, wherein said group of sectors consists of four sectors.

8. The method for erasing a memory device according to claim 1, further comprising selecting said group of sectors from a larger group of sectors so that said group of sectors can compose different combinations of the sectors in said larger group of sectors.

9. The method for erasing a memory device according to claim 8, wherein:
   a) said larger group of sectors consists of four sectors; and
   b) said selecting is capable of selecting one of said four sectors, two of said four sectors, or all four of said four sectors.

10. The method for erasing a memory device according to claim 9, wherein:
    a) said group of sectors is defined by a fast erase mode that forces the inverses of a number of address lines to a predetermined status; and
    b) said inverses of said number of address lines are not forced to said predetermined status during said verifying.

11. The method for erasing a memory device according to claim 1, wherein said verifying is passed if said current leakage is equal to or less than a predetermined threshold.

12. The method for erasing a memory device according to claim 11, wherein said predetermined threshold is equal to or less than 5 $\mu$A.

13. The method for erasing a memory device according to claim 11, wherein said verifying is performed individually on each column of memory cells, or sixteen input/outputs, in said group of sectors.

14. The method for erasing a memory device according to claim 1, wherein:
    a) said verifying is an Automatic Program Disturb Erase Verify (APDEV) function; and
    b) said correcting is an Automatic Program Disturb Erase (APDE) function.

15. The method for erasing a memory device according to claim 1, wherein:
    a) said group of sectors is defined by a fast erase mode that forces the inverses of a number of address lines to a predetermined status; and
    b) said inverses of said number of address lines are not forced to said predetermined status during said verifying.

16. The method for erasing a memory device according to claim 1, further comprising verifying that all the memory cells in said group of sectors has been erased.

* * * * *